(12) United States Patent
Bruchhaus et al.

(10) Patent No.: US 6,440,210 B1
(45) Date of Patent: Aug. 27, 2002

(54) METHOD FOR PRODUCING SELF-POLARIZED FERRO-ELECTRIC LAYERS, ESPECIALLY PZT LAYERS, WITH A RHOMBOHEDRAL CRYSTAL STRUCTURE

(75) Inventors: Rainer Bruchhaus, München; Dana Pitzer, Unterschleissheim; Robert Primig; Matthias Schreiter, both of München, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/787,378

(22) PCT Filed: Sep. 1, 1999

(86) PCT No.: PCT/DE99/02754

§ 371 (c)(1),
(2), (4) Date: Mar. 16, 2001

(87) PCT Pub. No.: WO00/17921

PCT Pub. Date: Mar. 3, 2000

(30) Foreign Application Priority Data

Sep. 18, 1998 (DE) .......................... 198 42 816

(51) Int. Cl.[7] ............................. C30B 1/02; C30B 29/30
(52) U.S. Cl. .................. 117/4; 117/9; 117/88; 117/948; 117/949; 428/446; 428/469; 428/701
(58) Field of Search ................ 117/948, 949, 117/7, 9, 88; 428/445, 469, 701, 702

(56) References Cited

U.S. PATENT DOCUMENTS

| | | | |
|---|---|---|---|
| 4,731,172 A | | 3/1988 | Adachi et al. |
| 5,308,462 A | * | 5/1994 | Iijima et al. ............ 204/192.15 |
| 5,719,417 A | | 2/1998 | Roeder et al. |
| 5,874,379 A | * | 2/1999 | Joo et al. .................... 501/138 |

FOREIGN PATENT DOCUMENTS

EP 237250 * 9/1987

OTHER PUBLICATIONS

Afanasjev et al., Polarization and self–polarization in thin PbZr TiO (PZT) films', J. Physics: Condens Matters vol. 13 2001, pp. 8755–9763.*
Tanaka et al, "Controlling factors on the synthesis of $Pb(Zr_xTi_{1-x})O_3$ films", *Thin Solid Films*, vol. 289, 1996, pp. 29–33.
Shimizu et al, "Control of Orientation of $Pb(Zr, Tl)O_3$ Thin Films Using $PbTiO_3$ Buffer Layer", *Japanese Journal of Applied Physics*, vol. 33, No. 9–B, Part 1, Sep. 1994, pp. 5167–5171.
Wang et al, "Preparation of Zr–Rich $Pb(Zr_xTi_{1-x})O_3$ Thin Films and Their Properties", *Integrated Ferroelectrics*, vol. 20, Nr 1–4, 1998, pp. 191–203.
Mantese et al, "Slater Model Applied to Polarization Graded Ferroelectrics", *App. Phys. Lett.*, vol. 71, No. 14, Oct. 6, 1997, pp. 2047–2049.

* cited by examiner

Primary Examiner—Robert Kunemund
(74) Attorney, Agent, or Firm—Morrison & Foerster LLP

(57) ABSTRACT

A method for producing self-polarized ferroelectric layers, in particular PZT layers, with a rhombohedral crystal structure includes providing a substrate and heating it to a temperature T1. Afterward the layer with a rhombohedral crystal structure is applied to the substrate by means of a sputtering method. This layer includes a Zr-deficient layer with a Curie temperature TC1 and a Zr-abundant layer with a Curie temperature TC2 wherein TC2<TC1<T1. After the ending of the application process, the heating of the substrate is also discontinued so that the substrate cools. As a result of the cooling the Zr-deficient layer and then the Zr-abundant layer reach their Curie temperature, and change into the ferroelectric phase and become self-polarized in the process. The polarization already present in the Zr-deficient layer induces the polarization in the Zr-abundant layer, with the result that both layers are self-polarized after the cooling process.

18 Claims, 1 Drawing Sheet

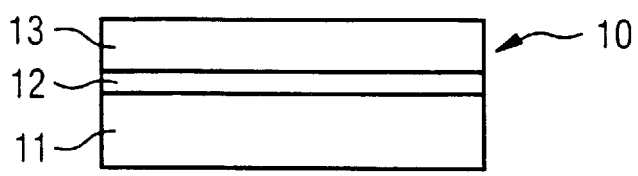
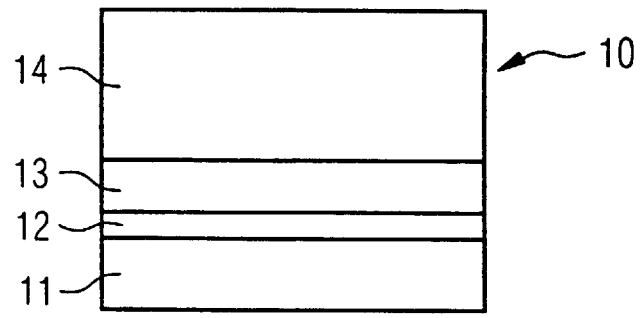
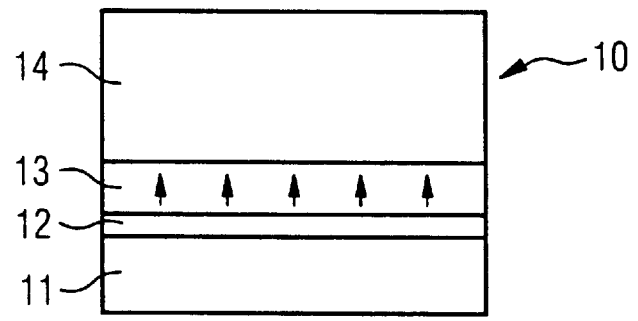
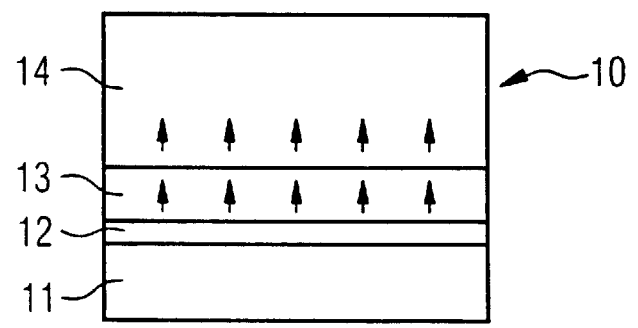

METHOD FOR PRODUCING SELF-POLARIZED FERRO-ELECTRIC LAYERS, ESPECIALLY PZT LAYERS, WITH A RHOMBOHEDRAL CRYSTAL STRUCTURE

BACKGROUND OF THE INVENTION

The present invention relates to a method for producing self-polarized ferroelectric layers, in particular PZT layers, with a rhombohedral crystal structure. Furthermore, the invention relates to layers of this type.

Ferroelectric layers are employed in diverse ways in the semiconductor industry. By way of example, they are integrated as ceramic components in the form of PZT layers in a finely patterned manner in silicon ICs (integrated circuits). Other possible applications for ceramic components of this type may be actuators or the like. PZT ceramics is understood in a general form to mean ceramics comprising the lead zirconate/lead titanate system. PZT ceramics are distinguished by the fact that they can have either a rhombohedral or a tetragonal structure, depending on the composition.

In order that ceramics of this type can be used optimally, they must be in the ferroelectric phase, that is to say polarized. In the case of PZT layers with a tetragonal crystal structure, it is possible to achieve that polarization through self-polarization of the layers. PZT layers with the tetragonal crystal structure have, for example, a Zr content (zirconium content) of less than 50%, and preferably from 10 to 30%. A transition into the ferroelectric state takes place when the absolute temperatures of the PZT layers fall below the Curie temperatures for the material. This possibility is described for example in the paper "Slater model applied to polarization graded ferroelectrics" by Mantese, Schubring, Micheli, Catalan, Mohammed, Naik and Auner in the journal *Appl. Phys. Lett.*, Vol. 71, No. 14, Oct. 6, 1997, pages 2047 to 2049.

PZT layers having the composition of the rhombohedral side of the phase diagram of the PZT ceramics which, for example, have a Zr content of greater than or equal to 50% have to be produced in an unpolarized fashion and subsequently be polarized by the application of an electric field in order to obtain the desired ferroelectric (pyroelectric) function. Since this requires a very high electric field, the polarization can only be effected in a costly manner. Furthermore, the high electric field brings about a high reject rate for the PZT layers, for instance due to the occurrence of electrical breakdowns or the like.

*Thin Solid Films*, Vol. 289 (1996), pages 29 to 33, discloses a method in which a self-polarized ferroelectric layer made of PZT ceramic is formed on a substrate made of $SiTiO_3$. The ferroelectric layer comprises a Zr-abundant layer and a Zr-deficient layer, the Zr-abundant layer being applied as a buffer layer between the substrate and the Zr-deficient layer. The Zr-deficient layer has a tetragonal crystal structure. The Zr-abundant layer is not purely rhombohedral, but tetragonalized on account of latticed distortions.

*Integrated Ferroelectrics*, Vol. 20, pages 191 to 203, reveals a method in which a self-polarized ferroelectric layer made of PZT ceramic is formed indirectly via an intermediate layer made of lead lanthanate/lead titanate (PLT) on a substrate made of platinum. The self-polarized PZT layer is Zr-abundant and has a rhombohedral crystal structure.

SUMMARY OF THE INVENTION

Taking the cited prior art as a departure point, the present invention is based on the object of providing a simple method which makes it possible to produce self-polarized ferroelectric layers, in particular PZT layers, with a rhombohedral crystal structure. Furthermore, the intention is to provide a corresponding ferroelectric layer.

This object is achieved by means of a method for producing a self-polarized ferroelectric layer, which is characterized by the following steps:

a) provision of a substrate and heating of the substrate to a temperature T1;

b) application of a layer combination to the substrate, where the layer combination is formed from a metal-deficient layer with a cubic crystal structure and a Curie temperature TC1 and a metal-abundant layer with a cubic crystal structure and a Curie temperature TC2, wherein T1>TC1>TC2, and wherein a metal deficiency and a metal abundance of the layers refers to a presence of at least one metal from the fourth subgroup of the Periodic Table; and c) ending of the heating of the substrate and cooling of the layer after the application process, so that the self-polarized layer is formed.

The method makes it possible in a simple manner to use a self-polarized layer for inducing the ferroelectric polarization in a material which otherwise does not become self-polarized. This means that it is possible to produce self-polarized ferroelectric layers, and in this case in particular PZT layers, with compositions of the rhombohedral side of the corresponding phase diagram.

The layer, in particular the PZT layer, is applied at the substrate temperatures which are higher than the Curie temperature of the layer. As a result, the layer grows with a cubic structure. Only after the actual application process, during the cooling of the layer, does the transition take place from the paraelectric cubic phase into the ferroelectric phase.

Self-polarized rhombohedral layers with a (111) texture have the advantage over self-polarized tetragonal layers with a (111) texture because the polarization is perpendicular to the substrate surface and the pyroelectric coefficient thereby becomes higher.

Any suitable material, for example platinum or the like, can be used for the substrate.

In a preferred embodiment of the method, the layer with a rhombohedral crystal structure can be applied in such a way that first a metal-deficient layer with a Curie temperature TC1 is applied to the substrate, and that afterward a metal-abundant layer with a Curie temperature TC2 is applied to the metal-deficient layer.

The relationship TC2<TC1<T1 holds true for the individual temperatures. In this case, the metal deficiency and the metal abundance of the layers refers to the presence of at least one metal from the fourth subgroup of the Periodic Table.

In a preferred embodiment of the invention, which, however, should not be understood to be exclusive, the metal-deficient layer is designed as a Zr-deficient layer and the metal-abundant layer is designed as a Zr-abundant layer.

In order to assist understanding of the invention, the formation of ferroelectric layers on a Zr basis is therefore described hereinafter. However, the ferroelectric layers can also be formed on the basis of other metals from the fourth subgroup of the Periodic Table.

The production of the rhombohedral layers, in particular PZT layers, with induced polarization is carried out in such a way that first the Zr-deficient layer is applied to the substrate. After this layer has been applied, the parameters on the respective application apparatus (for example a sputtering apparatus as described in more detail further below) are changed during the application process in such a way that a Zr-abundant layer then grows. Once the layer has reached the desired total thickness, the application process is ended. At the same time, the heating of the substrate is also discontinued, for instance by switching off a corresponding substrate heating arrangement. The substrate now cools and the Zr-deficient layer is the first to reach its Curie temperature, change into the ferroelectric phase and, in the process, become self-polarized. In the course of further cooling, the temperature of the layer approaches the Curie temperature of the Zr-abundant layer. In this case, the polarization already present in the Zr-deficient layer induces the polarization in the Zr-abundant layer and the entire layer is self-polarized after the cooling process. In this case, the lower Curie temperature of the Zr-abundant layer in comparison with the Zr-deficient layer allows a higher pyroelectric coefficient to be expected.

The same inducing effect can also be achieved if the Zr-deficient layer is applied on the Zr-abundant layer.

In accordance with another embodiment of the invention, it is provided that the layer with a rhombohedral crystal structure can be applied in such a way that first a metal-abundant layer with a Curie temperature TC2 is applied to the substrate, and that afterward a metal-deficient layer with a Curie temperature TC1 is applied to the metal-abundant layer. The relationship TC2<TC1<T1 holds true for the individual temperatures. In this case, the metal deficiency and the metal abundance of the layers refers to the presence of at least one metal of the fourth subgroup of the Periodic Table.

Zirconium (Zr) can once again advantageously be used as preferred metal.

Still other variants are also conceivable with regard to the possibilities for arranging the metal-deficient and the metal-abundant layers. Thus, by way of example, a plurality of metal-deficient and metal-abundant layers may be applied alternately on the substrate. It is also conceivable for a metal-abundant layer to be arranged in a sandwich-like manner between two metal-deficient layers, and for this arrangement to be arranged above one of the two metal-deficient layers on the substrate. The invention is not restricted to the two embodiments described in more detail above.

The metal-deficient layer may advantageously be applied with a thickness of about 100 nm on the substrate and/or the metal-abundant layer.

The layer with the rhombohedral crystal structure may be applied with a total thickness of about 1 $\mu$m. Layers having such a thickness are used as integrated pyrodetector arrays, for example.

In particular, it is advantageous if the metal-deficient layer is designed to be significantly thinner than the metal-abundant layer.

In a further configuration, first an electrode is applied to the substrate. The layer with a rhombohedral crystal structure is then subsequently applied to this electrode. The electrode may be connected to the substrate and the layer via suitable insulation and adhesion layers.

The layer with a rhombohedral crystal structure is advantageously applied to the substrate by means of a sputtering method. Sputtering methods are known from the prior art. By way of example, a multi-target sputtering method may be used.

When a sputtering method is used, a Zr-deficient layer may be sputtered onto the substrate. After that layer has been applied, the power levels on the targets are changed in the course of the deposition process in such a way that the Zr-abundant layer grows on the first applied layer, as has already been generally described above. Essentially, this involves increasing the power on the Zr and lead targets (if PZT layers are deposited).

The method as described above can advantageously be used for the production of self-polarized, ferroelectric, rhombohedral lead zirconium titanate layers.

In accordance with a further aspect of the present invention, a ferroelectric layer, in particular a PZT layer, is provided, which is self-polarized and which is arranged on a substrate. The ferroelectric layer is characterized in that the ferroelectric layer is formed from at least one metal-deficient layer with a tetragonal crystal structure and a Curie temperature TC1 and at least one metal-abundant layer with a rhombohedral crystal structure and a Curie temperature TC2, where: TC2<TC1 and where a metal deficiency and a metal abundance of the layers refers to the presence of at least one metal fro the fourth subgroup of the Periodic Table.

As a result, the disadvantages mentioned with regard to the prior art described above can be avoided. For the advantages, actions, effects and mode of operation of the ferroelectric layer, reference is hereby made to the entire contents of the above explanations concerning the production method.

In a further configuration, the metal-deficient layer may be arranged on the substrate and the metal-abundant layer may be arranged on the metal-deficient layer. In accordance with another embodiment the metal-abundant layer may be arranged on the substrate and the metal-deficient layer may be arranged on the metal-abundant layer. The other arrangement variants described above are also possible.

The metal-abundant and metal-deficient layers maybe designed as Zr layers.

The metal-deficient layer may advantageously have a thickness of about 100 nm. The ferroelectric layer may preferably have a total thickness of about 1 $\mu$m.

An electrode may be provided between the substrate and the ferroelectric layer with a rhombohedral crystal structure.

The invention will now be explained in more detail using an exemplary embodiment with reference to the accompanying drawing.

BRIEF DESCRIPTION OF THE DRAWING

FIGS. 1 to 4 are diagrammatic views illustrating a sequence of steps of the method.

DESCRIPTION OF THE PREFERRED EMBODIMENT

FIGS. 1 to 4 illustrate the production of a self-polarized ferroelectric PZT layer structure 10 (lead zirconium titanate layer) with a rhombohedral crystal structure.

FIG. 1 reveals that an electrode 12 is applied to a substrate 11 using suitable adhesion and insulation layers. The substrate 11 is heated to a temperature T1 by means of a substrate heating arrangement (not illustrated). A Zr-deficient layer 13 with a Curie temperature TC1 is then deposited on the electrode 12 by means of a sputtering method. The temperature ratio T1>TC1 holds true in this case.

Afterward, as shown in FIG. 2, a Zr-abundant layer 14 is sputtered onto the Zr-deficient layer 13 by increasing the power on the Zr- and lead targets (not illustrated) of the sputtering apparatus (likewise not illustrated). The Zr-abundant layer 14 has a Curie temperature TC2, where: TC2<TC1<T1.

FIG. 3 shows the ferroelectric layer structure 10 of the layers 13 and 14 after the ending of the deposition process. In the next step, the substrate heating arrangement is turned off. The substrate 11 now cools and the Zr-deficient layer 13 is the first to reach the Curie temperature TC1 and to change into the ferroelectric phase and, in the process, become self-polarized, as is illustrated by corresponding arrows in FIG. 3.

In the course of further cooling, as is shown in FIG. 4, the Zr-abundant layer 14 also reaches its Curie temperature TC2. In this case, the Zr-abundant layer 14 becomes self-polarized. At the same time, the polarization already present in the Zr-deficient layer 13 also induces the polarization in the Zr-abundant layer 14. This is once again illustrated by corresponding arrows.

After the ending of the cooling phase, the result is a ferroelectric layer structure 10 with a rhombohedral crystal structure which is completely self-polarized.

We claim:

1. A method for producing a self-polarized ferroelectric layer, said method comprising the following steps:

providing a substrate and heating the substrate to a temperature T1;

applying a layer structure to the substrate, the layer structure being formed from a metal-deficient layer with a cubic crystal structure and a Curie temperature TC1 and a metal-abundant layer with a cubic crystal structure and a Curie temperature TC2, wherein T1>TC1>TC2, and wherein a metal deficiency and a metal abundance of the layers refers to a presence of at least one metal from the fourth subgroup of the Periodic Table; and ending of the heating of the substrate and cooling of the layer structure after the step of applying so that the self-polarized layer structure is formed.

2. The method according to claim 1, wherein the step of applying the layer structure applies the metal-deficient layer on the substrate, and then applies the metal-abundant layer on the metal-deficient layer.

3. The method according to claim 1, wherein the step of applying the layer structure applies the metal-abundant layer to the substrate, and then applies the metal-deficient layer to the metal-abundant layer.

4. The method according to claim 1, wherein the metal-deficient layer is designed as a Zr-deficient layer and the metal-abundant layer is designed as a Zr-abundant layer.

5. The method according to claim 1, wherein the metal-deficient layer is applied with a thickness of about 100 mn.

6. The method according to claim 1, wherein the layer structure is applied with a total thickness of about 1 $\mu$m.

7. The method according to claim 1, wherein an electrode is applied to the substrate, and then the layer structure is applied to the electrode.

8. The method according to claim 1, wherein the layer structure is applied to the substrate by means of a sputtering method.

9. The method according to claim 1, wherein the method produces a self-polarized, ferroelectric lead zirconium titanate layer with a rhombohedral crystal structure.

10. A ferroelectric layer which is self-polarized and which is arranged on a substrate, the ferroelectric layer being formed from at least one metal-deficient layer with a tetragonal crystal structure and a Curie temperature TC1 and at least one metal-abundant layer with a rhombohedral crystal structure and a Curie temperature TC2, wherein TC2<TC1 and where a metal deficiency and a metal abundance of the layers refers to the presence of at least one metal from the fourth subgroup of the Periodic Table.

11. The ferroelectric layer according to claim 10, wherein the metal-deficient layer is arranged on the substrate, and the metal-abundant layer is arranged on the metal-deficient layer.

12. The ferroelectric layer according to claim 10, wherein the metal-abundant layer is arranged on the substrate, and the metal-deficient layer is arranged on the metal-abundant layer.

13. The ferroelectric layer according to claim 10, wherein the metal-deficient layer is a Zr-deficient layer, and the metal-abundant layer is a Zr-abundant layer.

14. The ferroelectric layer according to claim 10, wherein the metal-deficient layer has a thickness of about 100 nm.

15. The ferroelectric layer according to claim 10, wherein the ferroelectric layer has a total thickness of about 1 $\mu$m.

16. The ferroelectric layer according to claim 13, wherein an electrode is provided between a substrate and the ferroelectric layer.

17. The ferroelectric layer according to claim 10, wherein an electrode is provided between a substrate and the ferroelectric layer.

18. A ferroelectric layer according to claim 10, wherein the layer is a PZT layer.

\* \* \* \* \*